US008445102B2

(12) United States Patent
Strader et al.

(10) Patent No.: US 8,445,102 B2
(45) Date of Patent: May 21, 2013

(54) THERMAL INTERFACE MATERIAL WITH THIN TRANSFER FILM OR METALLIZATION (75) Inventors: Jason L. Strader, Cleveland, OH (US); Mark Wisniewski, Mentor, OH (US); Karen Bruzda, Cleveland, OH (US); Michael D. Craig, Painesville, OH (US)

(73) Assignee: Laird Technologies, Inc., Earth City, MO (US)

( * ) Notice: Subject to any disclaimer, the term of this patent is extended or adjusted under 35 U.S.C. 154(b) by 1211 days.

(21) Appl. No.: 12/204,228

(22) Filed: Sep. 4, 2008

(65) Prior Publication Data
US 2009/0117345 A1 May 7, 2009

Related U.S. Application Data (63) Continuation-in-part of application No. 11/938,588, filed on Nov. 12, 2007.

(60) Provisional application No. 60/985,418, filed on Nov. 5, 2007.

(51) Int. Cl.
*B32B 15/08* (2006.01)
*B32B 37/10* (2006.01)
*B32B 38/10* (2006.01)

(52) U.S. Cl.
USPC ........ 428/336; 428/457; 156/233; 264/173.1; 427/294; 427/428.01

(58) Field of Classification Search
None
See application file for complete search history.

(56) References Cited

U.S. PATENT DOCUMENTS

| | | | |
|---|---|---|---|
| 2,678,285 A | 5/1954 | Browning | |
| 3,723,373 A | 3/1973 | Lucas | |
| 4,047,804 A | 9/1977 | Stephens | |
| 4,686,141 A | 8/1987 | Burns et al. | |
| 4,938,992 A | 7/1990 | Mears | |
| 5,300,809 A | 4/1994 | Nakamura et al. | |
| 5,314,732 A | 5/1994 | Wiste | |
| 5,591,034 A | 1/1997 | Ameen et al. | |
| 5,679,457 A | 10/1997 | Bergerson | |
| 5,738,936 A | 4/1998 | Hanrahan | |
| 5,741,579 A | 4/1998 | Nishizawa | |

(Continued)

FOREIGN PATENT DOCUMENTS
EP 1641040 A2 3/2006
GB 2336432 A * 10/1999

(Continued)

OTHER PUBLICATIONS

International Search Report and Written Opinion for PCT/US2009/043716, dated Feb. 17, 2010, 9 pages.
European Search Report from European application No. 08874148 which is related to the instant application through a priority claim, dated Jan. 19, 2011, 3 pages.
European Office Action from European application No. 08874148 (now published as EP2207674) which is related to the instant application through a priority claim, dated Mar. 17, 2011, 5 pages.

(Continued)

*Primary Examiner* — Ramsey Zacharia
(74) *Attorney, Agent, or Firm* — Harness, Dickey & Pierce, P.L.C.

(57) ABSTRACT

According to various aspects, exemplary embodiments are provided of thermal interface material assemblies. In one exemplary embodiment, a thermal interface material assembly generally includes a thermal interface material having a first side and a second side and a dry material having a thickness of about 0.0005 inches or less. The dry material is disposed along at least a portion of the first side of the thermal interface material.

33 Claims, 7 Drawing Sheets

U.S. PATENT DOCUMENTS

| | | | |
|---|---|---|---|
| 5,912,805 | A | 6/1999 | Freuler et al. |
| 5,930,893 | A | 8/1999 | Eaton |
| 5,950,066 | A | 9/1999 | Hanson et al. |
| 6,037,659 | A * | 3/2000 | Weixel .......... 257/717 |
| 6,054,198 | A | 4/2000 | Bunyan et al. |
| 6,090,484 | A | 7/2000 | Bergerson |
| 6,162,663 | A | 12/2000 | Schoenstein et al. |
| 6,165,612 | A | 12/2000 | Misra |
| 6,197,859 | B1 * | 3/2001 | Green et al. ........ 524/270 |
| 6,344,104 | B1 | 2/2002 | Sekiya et al. |
| 6,359,334 | B1 | 3/2002 | Jiang |
| 6,372,997 | B1 | 4/2002 | Hill et al. |
| 6,399,209 | B1 | 6/2002 | Misra et al. |
| 6,451,422 | B1 | 9/2002 | Nguyen |
| 6,461,722 | B1 | 10/2002 | Kittel et al. |
| 6,523,608 | B1 | 2/2003 | Solbrekken et al. |
| 6,613,430 | B2 | 9/2003 | Culbertson et al. |
| 6,644,395 | B1 | 11/2003 | Bergin |
| 6,657,296 | B2 | 12/2003 | Ho et al. |
| 6,657,297 | B1 | 12/2003 | Jewram et al. |
| 6,761,928 | B2 | 7/2004 | Hill et al. |
| 6,776,923 | B2 | 8/2004 | Balian et al. |
| 6,835,453 | B2 | 12/2004 | Greenwood et al. |
| 6,900,163 | B2 | 5/2005 | Khatri |
| 6,913,812 | B2 | 7/2005 | Nishio et al. |
| 6,919,504 | B2 | 7/2005 | McCutcheon et al. |
| 6,946,190 | B2 | 9/2005 | Bunyan |
| 6,965,071 | B2 | 11/2005 | Watchko et al. |
| 6,974,723 | B2 | 12/2005 | Matayabas, Jr. et al. |
| 7,037,594 | B2 | 5/2006 | Kojima et al. |
| 7,078,109 | B2 | 7/2006 | Hill et al. |
| 7,147,367 | B2 | 12/2006 | Balian et al. |
| 7,229,683 | B2 | 6/2007 | Fischer et al. |
| 2001/0006715 | A1 * | 7/2001 | Pinter et al. ........ 428/90 |
| 2002/0034651 | A1 | 3/2002 | Yamagata et al. |
| 2004/0009353 | A1 | 1/2004 | Knowles et al. |
| 2004/0161571 | A1 * | 8/2004 | Duvall et al. ....... 428/40.5 |
| 2005/0013119 | A1 | 1/2005 | Misra |
| 2005/0073816 | A1 * | 4/2005 | Hill et al. ........ 361/708 |
| 2005/0077618 | A1 | 4/2005 | McCutcheon et al. |
| 2005/0256241 | A1 | 11/2005 | Sachdev et al. |
| 2006/0128068 | A1 | 6/2006 | Murray et al. |
| 2006/0194043 | A1 | 8/2006 | Nishiyama et al. |
| 2006/0197176 | A1 | 9/2006 | Yang |
| 2006/0292359 | A1 | 12/2006 | Nishio |
| 2007/0164424 | A1 | 7/2007 | Dean et al. |
| 2007/0230130 | A1 | 10/2007 | Alcoe et al. |
| 2007/0231967 | A1 | 10/2007 | Jadhav et al. |
| 2007/0235861 | A1 | 10/2007 | Chien et al. |
| 2007/0241303 | A1 | 10/2007 | Zhong et al. |
| 2009/0166854 | A1 | 7/2009 | Jewram et al. |

FOREIGN PATENT DOCUMENTS

| | | |
|---|---|---|
| JP | 10-079594 | 3/1998 |
| JP | 2003-086991 | 3/2003 |
| JP | 2004-080040 | 3/2004 |
| JP | 2004-228217 | 8/2004 |
| JP | 2006-528434 | 12/2006 |
| WO | WO 2006/017193 | 2/2006 |

OTHER PUBLICATIONS

Office Action from co-pending U.S. Appl. No. 11/938,588 which is related to the instant application through a priority claim; dated Mar. 1, 2011; 20 pages.

Japanese Office Action (dated Jan. 17, 2012) from related co-pending Japanese Patent Aplication No. 2010/533134 which is a national phase of PCT International Application No. PCT/US2008/075172 which claims priority to U.S. Appl. No. 11/938,588. The instant application is a continuation-in-part U.S. Appl. No. 11/938,588; 4 pages.

Final Office Action from U.S. Appl. No. 11/938,588 dated Aug. 31, 2011; the instant application is a continuation-in-part of U.S. Appl. No. 11/938,588.

Thermally Conductive, Reworkable, Elastromeric Interposer for Chip to Heat Sink Attachment: Dec. 1, 1992 UTC United States English (United States); IBM Technical Disclosure Bulletin, vol. 5, No. 37, Dec. 1992; pp. 241-242.

Flexible Heat Conducting Sheet Material for Semiconductor Packages: Apr. 1, 1983 UTC United States English (United States); IBM disclosure Apr. 1983; pp. 5740-5743.

Ablefilm 566k Low Temperature Cure Adhesive Film: Technical Data Sheet; Published: Nov. 1995, 2 pages.

Hi-Flow® 225FT, Reworkable, Pressure Sensitive Phase Change Material: The Bergquist Company (www.bergquistcompany.com), 1 page (accessed and printed from Internet on Oct. 23, 2007).

MultiPhase™—T557 & T558, Low Thermal Resistance Thermflow™ Phase Change Pads: Chomerics (www.chomerics.com), 2 pages (accessed and printed from Internet on Oct. 23, 2007).

Website: http://www.electronicsweekly.com/products/2007/10/05/2057/bergquist+sil-pad+1200+thermal+interface+material.htm;

Products—Emech & Enclosures; Bergquist SIL-PAD 1200 thermal interface material, Published: Oct. 5, 2007, 3 pages.

Website: http://www.loctite.com/int_henkel/loctite/binarydata/pdf/lt3758a_PhaseChange.pdf; Henkel International; Date Accessed: Oct. 15, 2007, 2 pages.

T-mate™ 2900 Series (accessed and retrieved from Internet Oct. 23, 2007), 2 pages.

T-flex™ 600 Series Thermal Gap Filler (accessed and retrieved from Internet Nov. 9, 2007), 2 pages.

T-gard™ 500, (accessed and retrieved from Internet Nov. 9, 2007), 2 pages.

T-pcm™ 580 Series, (accessed and retrieved from Internet Nov. 9, 2007), 2 pages.

T-pli™ 200 Series Gap Filler, (accessed and retrieved from Internet Nov. 9, 2007), 2 pages.

T-flex™ 300 Series Thermal Gap Filler (accessed and retrieved from Internet Nov. 9, 2007), 2 pages.

Infiltration and Embedding Protocol for Cells Grown on Cellophane/Dialysis Squares or Fixed Fruitbody Pieces, Modified Jan. 4, 2007, http://www3.cbs.umn.edu/labs/davem/Embed.doc, 2 pages.

* cited by examiner

THERMAL INTERFACE MATERIAL WITH THIN TRANSFER FILM OR METALLIZATION

CROSS-REFERENCE TO RELATED APPLICATION

This application claims the benefit of U.S. Provisional Application No. 60/985,418 filed Nov. 5, 2007.

This application is a continuation-in-part of U.S. patent application Ser. No. 11/938,588 filed Nov. 12, 2007, which, in turn, claims the benefit of U.S. Provisional Application No. 60/985,418 filed Nov. 5, 2007. The entire disclosures of the above applications are incorporated herein by reference in their entirety.

FIELD

The present disclosure generally relates to thermal interface materials for establishing thermal-conducting heat paths from heat-generating components to a heat dissipating and/or spreading member (for simplicity purposes from this point forward referred to as a heat sink).

BACKGROUND

The statements in this section merely provide background information related to the present disclosure and may not constitute prior art.

Electrical components, such as semiconductors, transistors, etc., typically have pre-designed temperatures at which the electrical components optimally operate. Ideally, the pre-designed temperatures approximate the temperature of the surrounding air. But the operation of electrical components generates heat which, if not removed, will cause the electrical component to operate at temperatures significantly higher than its normal or desirable operating temperature. Such excessive temperatures may adversely affect the operating characteristics of the electrical component and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor. In some devices, an electrical insulator may also be placed between the electrical component and the heat sink, in many cases this is the TIM itself.

SUMMARY

According to various aspects, exemplary embodiments are provided of thermal interface material assemblies. In one exemplary embodiment, a thermal interface material assembly generally includes a thermal interface material having a first side and a second side and a dry material having a thickness of about 0.0005 inches or less. The dry material is disposed along at least a portion of the first side of the thermal interface material.

In another exemplary embodiment, a thermal interface assembly generally includes a thermal interface material having a first side and a second side and a metal layer having a thickness of about 0.0005 inches or less. The metal layer has first and second sides. The first side of the metal layer is disposed along at least a portion of the first side of the thermal interface material. A polymer coating is on at least a portion of the second side of the metal layer.

Additional aspects provide methods relating to thermal interface material assemblies, such as methods of using and/or making thermal interface assemblies. In one exemplary embodiment, a method for making a thermal interface material assembly generally includes providing a thermal interface material with a dry material along at least a portion of a first side of the thermal interface material such that the dry material has a thickness of about 0.0005 inches or less.

Another exemplary embodiment provides a method associated with heat transfer from a heat-generating component. In this exemplary embodiment, a method generally includes installing a thermal interface material assembly generally between a surface of a heat-generating component and a surface of a heat sink to thereby establish a thermally conducting heat path defined by the heat-generating component, the thermal interface material assembly, and the heat sink. The thermal interface material assembly may include a thermal interface material and a dry material having a thickness of about 0.0005 inches or less disposed along at least a portion of the thermal interface material.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is in no way intended to limit the present disclosure, application, or uses.

Thermal interface materials with thick foils have been used between heat-generating components and heat sinks to establish heat-conduction paths therebetween. As recognized by the inventors hereof, however, the thickness of the foil (e.g., one mil thick, two mils thick, etc.) results in a relative long heat conduction path, such that the foil thickness negatively impacts thermal performance by increasing thermal impedance. Despite the negative thermal impact, foils having thicknesses of one mil or even two mils are presently used as self-supporting, stand-alone, free-standing materials that can be applied to thermal interface materials without using carrier liners. Plus, thin metal layers or transfer films are usually too fragile to be self-supporting and thus do not lend themselves to handling as a stand-alone layer.

Figure 10A:
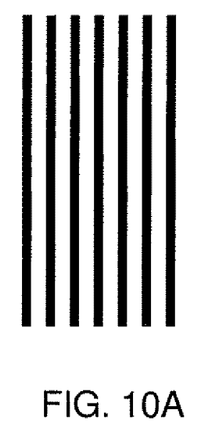
FIGS. 10A, 10B, and 10C illustrate exemplary patterns in which a thin dry material may be provided to a thermal interface material according to exemplary embodiments.
Figure 10B:
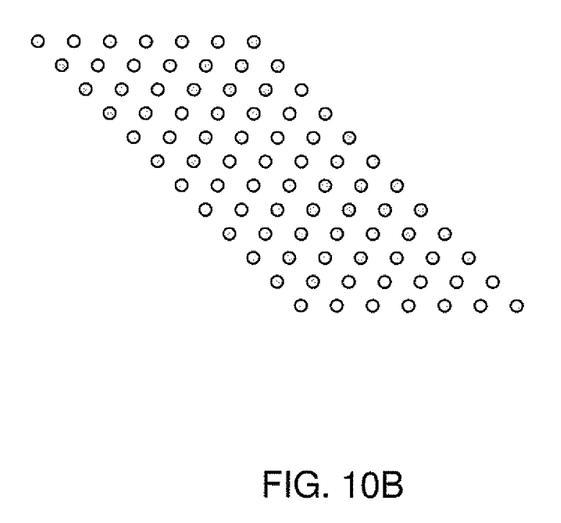
Figure 10C:
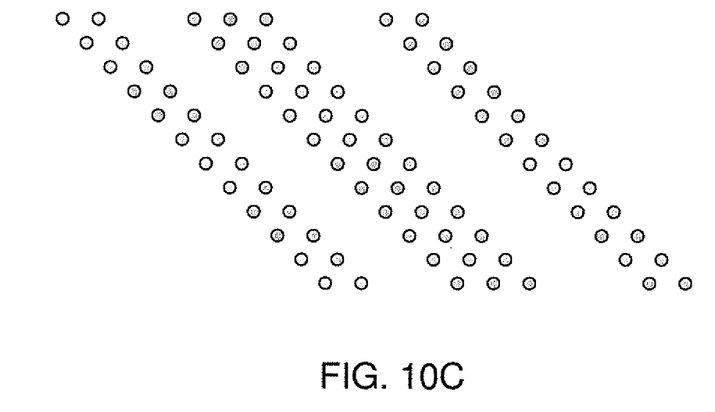

Because the inventors hereof recognized that the use of thinner foils provides shorter heat-conduction paths, the inventors have disclosed herein various exemplary embodiments that include thermal interface materials having along at least portion thereof one or more of a thin metallization, a thin metal layer, a thin metal layer with a polymer coating on at least a portion thereof (e.g., a 5 angstrom thick polymer coating on the side of the metal layer opposite the thermal interface material, etc.), and/or a thin dry material (e.g., a film or layer of polymer or other dry material across a portion or across an entire surface of the thermal interface material, a dry material in a predetermined pattern, such as a striped pattern (FIG. 10A), a uniform dotted pattern (FIG. 10B), a non-uniform dotted pattern (FIG. 10C), etc.). The reduced thickness of the metallization, metal layer, metal layer/polymer coating, and/or dry material allows for improved thermal performance of the thermal interface material assembly as compared to those thermal interface material assemblies having much thicker foils.

In addition to short heat paths providing lower thermal impedance for the heat-conducting path, the thinness of the metallization, metal layer, metal layer/polymer coating, and/or dry film also allows for good conformance with a mating surface, which also helps lower thermal impendence as thermal impedance also depends, at least in part, upon the degree of effective surface area contact therebetween. The ability to conform to a mating surface tends to be important as the surfaces of a heat sink and/or a heat-generating component are typically not perfectly flat and/or smooth, such that air gaps or spaces (air being a relatively poor thermal conductor) tend to appear between the irregular mating surfaces and thus increase the path's impedance to thermal conduction. Therefore, removal of air spaces may thus also help lower the heat-conducting path's thermal impedance and increases the path's thermal conductivity, thereby enhancing the conducting of heat along the path.

Various embodiments disclosed herein include a thin metallization, thin metal layer, thin metal layer/polymer coating, and/or thin dry material (e.g. thin dry film, layer, pattern, etc.), which will have less of an adverse affect (smaller increase in thermal impedance or resistance) on the thermal performance of the thermal interface materials, as compared thermal interface materials with thicker foils. To help illustrate this, the following non-limiting examples and test results are provided for purposes of illustration only and not for limitation. The thermal resistance was measured for test specimens made from T-pcm™ 580S series thermal phase change materials available from Laird Technologies, Inc. For the test specimens, foils were applied or coated onto the thermal phase change materials in different foil thicknesses. The thermal resistance was determined to be 0.019° Celsius-in$^2$/W for a test specimen having a foil with a 0.0001 inch thickness applied to a T-pcm™ 580S series thermal phase change material via transfer from a polyester film. By way of comparison, the thermal resistance was determined to be 0.04° Celsius-in$^2$/W for a test specimen having a self-supporting or free-standing film with a thickness of 0.0007 inches.

In addition to thermal performance improvement, some exemplary embodiments disclosed herein also include a protective liner on or over one or more relatively thin layers or films (e.g., metallization, thin metal layer, thin metal layer/polymer coating, thin dry material, film or layer, etc.). In such embodiments, the protective liner may be removed before installation of the thermal interface material assembly. Use of the protective liner may thus help reduce the chance of surface imperfections in the thin layer or film, which may sometimes occur when self-supporting or free-standing stand-alone thick foils are used without any protective liners.

Accordingly, various exemplary embodiments of thermal interface material assemblies are disclosed herein that include a thermal interface material with a thin metallization, thin metal layer, thin metal layer/polymer coating, and/or thin dry material/film/layer. The presence of a thin material, film, layer, or coating on at least a portion of the thermal interface material (e.g., polymer coating, dry film, transfer film, etc.) allows the thermal interface material assemblies to be capable of releasing cleanly and easily from mating components, for example, to permit ready access for reworking to a printed circuit board, central processing unit, graphics processing unit, memory module, or other heat-generating component. In addition, the thin metallization, thin metal layer, thin metal layer/polymer coating, and/or thin dry material (e.g. dry film, dry layer, dry pattern, etc.) may also provide one or more of the following advantages in some embodiments: reduced electrostatic discharge of the thermal interface material; preventing (or at least reduced possibility of) thermal interface material constituents (e.g., silicone, etc.) from contacting and possibly contaminating mating surfaces; electrical conductivity or electrical isolation on the side of the thermal interface material having a metallization, metal layer, or electrically-conductive film; light from LEDs or other light sources being reflected off the side of the thermal interface material having the metallization, metal layer, metal, or dry material.

Also disclosed herein are exemplary embodiments of thermal interface material assemblies that include relatively thin dry materials having thicknesses of 0.0005 inches or less (e.g., 0.0005 inches, 5 angstroms, etc.), where the thin dry material may be disposed along one or both sides of a compliable or conformable thermal interface material (e.g., gap filler, phase change material, putty, thermally conductive insulator, etc.). By way of example, the thin dry material may comprise a thin dry film, thin dry layer, thin dry material in a predetermined pattern (e.g., a striped pattern (FIG. 10A), a uniform dotted pattern (FIG. 10B), and a non-uniform dotted pattern (FIG. 10C), etc.), polymer, metal, plastic, or paper materials, films, or layers, etc. In these exemplary embodiments having thin dry materials, the thin dry material may be configured to allow for a relatively clean and easy release of the thermal interface material assembly from the surface against which the dry material was positioned. For example, the thermal interface material assembly may be positioned, sandwiched, or installed between a heat sink and a heat-generating component (e.g., printed circuit board assembly, central processing unit, graphics processing unit, memory module, other heat-generating component, etc.), such that the dry material is in contact with or against a surface of the heat-generating component, whereby a thermally conducting heat path is defined from the heat-generating component, to the dry material, to the thermal interface material, and then to the heat sink. In this latter example, the dry material may thus allow for a clean release of the thermal interface material assembly from the heat-generating component, such as for obtaining access to the heat-generating component for servicing, repair, replacement, etc. As another example, the thermal interface material assembly may be positioned, sandwiched, or installed between a heat-generating component and a heat sink with the dry material against a surface of the heat sink, such that a thermally conducting heat path is defined from the heat-generating component, to the thermal interface material, to the dry material, and then to the heat sink. In this second example, the dry material may thus allow for a clean release of the thermal interface material assembly from the heat sink, such as when the heat sink is removed for obtaining access to the heat-generating component for servicing, repair, replacement, etc.

In addition, the dry material may also provide one or more of the following advantages in some embodiments. For example, the dry material may be configured to cause a preferential release from a preferred surface, in order to stay with or stick to a heat sink rather than a heat-generating component. The dry material may allow for easier handling and installation by inhibiting adherence, stickiness or tacky surface tack, such as to the hands of the installer or to a surface of a component. The dry material may also allow for increased manufacturing line speed and reduced manufacturing and/or shipping costs, such as when the thermal interface material assembly includes only one release liner instead of two or more release liners. The dry material may provide improved product strength with less adverse impact on the thermal performance as compared to products whose strength has been reinforced via fiberglass. In various embodiments, the dry material may be colored or have a different color than the thermal interface material, such that the dry material is more readily recognizable and/or differentiated from the thermal interface material. In turn, this coloring scheme may allow an installer to more quickly and easily determine the proper orientation for installing the TIM assembly, such as which side of the TIM assembly should be placed in contact with the heat sink and which side should be placed in contact with the heat-generating electronic component. Depending on the particular materials being used with the TIM assembly, the dry material may have a higher or lower thermal conductivity than the thermal interface material, and/or be more or less conformable than the thermal interface material.

Figure 1:
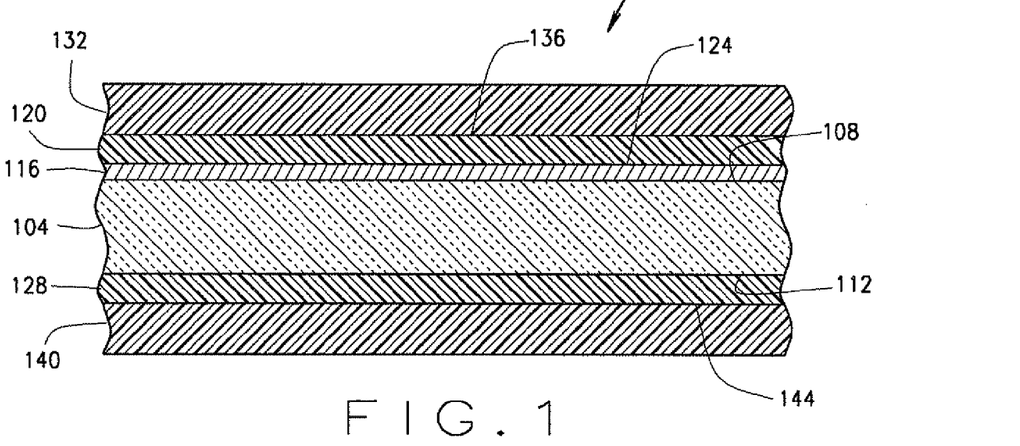
FIG. 1 is a cross-sectional view of a thermal interface material assembly having a thermal interface material, a metallization or metal layer, release coatings, and release liners according to exemplary embodiments.

Referring now to FIG. 1, there is shown an exemplary embodiment of a multi-layered construction or thermal interface material (TIM) assembly 100 embodying one or more aspects of the present disclosure. As shown in FIG. 1, the illustrated TIM assembly 100 generally includes a thermal interface material 104, a metallization, metal layer, or dry material (e.g., dry film or layer, etc.) 116, release coatings 120, 128, and release liners 132 and 140 (or more broadly, substrates or supporting layers 132 and 140). The various portions 104, 116, 120, 128, 132, and 140 of the TIM assembly 100 are described in more detail herein.

Alternatively, other embodiments include TIM assemblies that do not include either one or both release coatings 120, 128 and/or do not include either or both release liners 132, 140. For example, another embodiment of a TIM assembly generally includes a thermal interface material (e.g., 104, etc.) and a metallization, metal layer, or dry material (e.g., 116, etc.), without any release coatings 120 or 128 or any release liners 132, 140. Further embodiments of a TIM assembly generally include a thermal interface material (e.g., 104, etc.), a metallization, metal layer, or dry material (e.g., 116, etc.), and upper and lower release liners (e.g., 120, 128, etc.), without any release coatings (e.g., 120, 128, etc.) between the lower release liner and the thermal interface material or between the upper release liner and metallization, metal layer or dry material. Additional embodiments of a TIM assembly generally include a thermal interface material (e.g., 104, etc.), a metallization, metal layer, or dry material (e.g., 116, etc.), upper and lower release liners (e.g., 120, 128, etc.), and only a release coating (e.g., 128, etc.) that is between the lower release liner and the thermal interface material, such that these embodiments of the TIM assembly do not include any release coating (e.g., 120, etc.) between the upper release liner and the metallization, metal layer, or dry material. One particular embodiment of a TIM assembly generally includes a thermal interface material (e.g., 104, etc.), a dry material (e.g., 116, a film or layer of dry material, etc.), upper and lower release liners (e.g., 120, 128, etc.), and only a release coating (e.g., 128, etc.) that is between the lower release liner and the thermal interface material, such that there is no release coating (e.g., 120, etc.) between the upper release liner and the dry material. In this particular example, the dry material is directly against the upper release liner, and the dry material is formulated to release from the upper release liner without the need for a release coating between the upper release liner and dry material. Alternative embodiments, however, may include a release coating between the dry material and the release liner.

In various embodiments disclosed herein, the thermal interface material 104 may be formed from various materials, some of which are listed below in a table setting forth exemplary materials from Laird Technologies, Inc. of Saint Louis, Mo., and, accordingly, identified by reference to trademarks of Laird Technologies, Inc. The table and the materials listed therein may be used as a thermal interface material in any one or more exemplary embodiments disclosed herein, and is provided for purposes of illustration only and not for purposes of limitation.

In some embodiments, the thermal interface material 104 is a gap filler (e.g., T-flex™ gap fillers or T-pli™ gap fillers from Laird Technologies, etc.). By way of example, the gap filler may have a thermal conductivity of about 3 W/mK and a thermal impedance (as determined at ten pounds per square inch using ASTM D5470 (modified test method)) of about 0.46° Celsius-in$^2$/W, or 0.62° Celsius-in$^2$/W, or 0.85° Celsius-in$^2$/W, or 1.09° Celsius-in$^2$/W, or 1.23° Celsius-in$^2$/W, etc. By way of further example, the gap filler may have a thermal conductivity of about 1.2 W/mK and a thermal impedance (as determined at ten pounds per square inch using ASTM D5470 (modified test method)) of about 0.84° Celsius-in$^2$/W, or 1.15° Celsius-in$^2$/W, or 1.50° Celsius-in$^2$/W, or 1.8° Celsius-in$^2$/W, or 2.22° Celsius-in$^2$/W, etc. Additional exemplary gap fillers may have a thermal conductivity of about 6 W/mK and a thermal impedance (as determined at ten pounds per square inch using ASTM D5470 (modified test method)) of about 0.16° Celsius-in$^2$/W, or 0.21° Celsius-in$^2$/W, or 0.37° Celsius-in$^2$/W, or 0.49° Celsius-in$^2$/W, 0.84° Celsius-in$^2$/W, etc.

In other embodiments, the thermal interface material 104 is a phase chase change material (e.g., T-pcm™ 580S series phase change material from Laird Technologies, Inc., etc.). By way of example, the phase change material may have an phase change softening point of about 50° Celsius, an operating temperature range of about −40° Celsius to 125° Celsius, a thermal conductivity of about 3.8 W/mK and a thermal impedance (as determined at ten pounds per square inch using ASTM D5470, (modified test method)) of about 0.019° Celsius-in$^2$/W, or 0.020° Celsius-in$^2$/W, etc.

In still further embodiments, the thermal interface material 104 is a thermally conductive insulator (e.g., T-gard™ 500 thermally conductive insulators from Laird Technologies, etc.). By way of example, the thermally conductive insulator may have a thermal impedance (as determined at ten pounds per square inch using ASTM D5470 (modified test method)) of about 0.6° Celsius-in$^2$/W, etc.

The table immediately below lists various exemplary thermal interface materials that may be used as a thermal interface material in any one or more exemplary embodiments described and/or shown herein. These exemplary materials are commercially available from Laird Technologies, Inc. of Saint Louis, Mo., and, accordingly, have been identified by reference to trademarks of Laird Technologies, Inc. This table and the materials and properties listed therein are provided for purposes of illustration only and not for purposes of limitation.

| Name | Construction Composition | Type |
| --- | --- | --- |
| T-flex ™ 300 | Ceramic filled silicone elastomer | Gap Filler |
| T-flex ™ 600 | Boron nitride filled silicone elastomer | Gap Filler |
| T-pli ™ 200 | Boron nitride filled, silicone elastomer, fiberglass reinforced | Gap Filler |
| T-pcm ™ 580 | Metal/ceramic filled matrix | Phase Change Material |
| T-pcm ™ 580S | Metal/ceramic filled matrix | Phase Change Material |
| T-gard ™ 500 | Ceramic filled silicone rubber on electrical grade fiberglass | Thermally Conductive Insulator |

In addition to the examples listed in the table above, other thermal interface materials may also be used, which are preferably better thermal conductors than air alone. Other exemplary materials include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermal putties, thermal greases, thermally-conductive additives, etc. In some embodiments, one or more conformable thermal interface pads are used having sufficient compressibility and flexibility for allowing a pad to relatively closely conform to the size and outer shape of an electrical component when placed in contact with the electrical component when the shielding apparatus is installed to a printed circuit board over the electrical component. By engaging the electrical component in this relatively close fitting and encapsulating manner, a conformable thermal interface pad can conduct heat away from the electrical component to the cover in dissipating thermal energy. Additionally, thermal interface may also be formed from sufficiently soft, conformable, and/or compliable materials to be relatively easily forced into or extruded into the holes in a cover as disclosed herein.

With further reference to FIG. 1, the TIM assembly 100 includes the metallization, metal layer, or dry material 116 disposed generally between the release coating 120 and an upper surface or first side 108 of the thermal interface material 104. The metallization, metal layer, or dry material 116 may be formed from various materials, which preferably have little to no impact on thermal resistance and are relatively compliant, conformable or flexible for conforming to a surface (e.g., a surface of a heat-generating component or heat sink, etc.). Using a material that is a good thermal conductor and capable of good conformance with a mating surface helps provide a lower thermal impendence. Depending on the particular materials being used with the TIM assembly 100, the metallization, metal layer, or material 116 may be formed from a material having a higher or lower thermal conductivity than the thermal interface material 104, and/or that is more or less conformable than the thermal interface material 104. In addition, the metallization, metal layer, or dry material 116 may also help the thermal interface material 104 release cleanly and easily from a heat-generating component or heat sink, for example, for reworking or servicing the heat-generating component. In some exemplary embodiments, the dry material 116 comprises a film or layer of material (e.g., polymer, paper, plastic, etc.) configured to allow for relatively clean and easy release from a surface of a heat-generating component or heat sink. In such embodiments, the dry film and thermal interface material (to which the dry film was provided or applied to form the thermal interface material assembly) may thus be removed, from the surface against which the dry film was positioned, collectively as a single combined assembly while the dry film remains attached to or disposed along the thermal interface material. In other exemplary embodiments, there is a metallization or metal layer 116 comprising copper. In still other exemplary embodiments, a thermal interface material may include or be provided with a metallization or metal layer having a coating (e.g., polymer coating, etc.) 116 on a surface of the metallization or metal layer generally opposite the thermal interface material. Alternative embodiments may include one or more other materials used for the metallization, metal layer, or dry material 116, including other metals besides copper (e.g., argentum, tin, etc.), alloys, non-metal materials, polymers, plastics, paper materials, etc. By way of further example, exemplary embodiments may include a metallization or metal layer 116 comprising aluminum having a thickness of less than or equal to about 0.0005 inches. Other embodiments may have a metallization, metal layer, or dry material 116 with a thickness of about 0.0002 inches, 0.0001 inches, 5 angstroms, less than 0.0001 inches, less than 5 angstroms, etc. Also disclosed herein, the metallization, metal layer, or dry material 116 may be provided in some embodiments as a subcomponent or part of a product from the Dunmore Corporation of Bristol, Pa., such as products under the trade name Dun-Tran (e.g., Dunmore DT273 metallized film having a heat-activated adhesive layer, Dunmore DT101 metallization transfer layer, etc.) or other products having a metallization or metal layer or film with a polymer coating.

Various processes and technologies may be employed to provide a thermal interface material with a metallization, metal layer, or dry material depending on the particular embodiment. Some example processes include vapor deposition, vacuum metallization, lamination, calendaring, sputtering, electrolytic plating, evaporating, flash coating, coating using gravure, flexographic coating, printing in a pattern, other coating technologies, transferring or providing via a transfer carrier (e.g., polyester liner, etc.), among other suitable processes. By way of example, a dry material may be configured to release from a carrier liner for transfer to a thermal interface material. In such example, the thermal interface material may thus be provided with the dry material by transferring the dry material from the carrier liner to the thermal interface material.

In addition, FIG. 1 only shows a single metallization, metal layer, or layer/film of dry material 116. Alternative embodiments may include a second/lower metallization, metal layer, or layer/film of dry material below the thermal interface material. In addition, some embodiments may include more than one metallization, metal layer, or layer/film of dry material (e.g., multiple layers of different metal materials, multiple layers of the same material, multiple layers of different alloys, multiple layers of non-metallic layers, multiple layers including one or more metallic layers and/or one or more non-metallic layers, multiple layers of dry material, etc.) disposed, coated, transferred, applied, or otherwise provided fully or partially on one, both, or all sides and/or surfaces of a thermal interface material. For example, another embodiment may include a first copper metallization or metal layer formed directly on top of the thermal interface material, and a second nickel metallization or metal layer formed directly on top of the copper, for example, through sputtering technology to improve oxidation resistance. Another example may include a metallization or metal layer formed directly on top of the thermal interface material with a polymer coating directly on top of the metallization or metal layer. Still another example may include a layer or film of dry material (e.g., dry polymer film, etc.) directly on top of the thermal interface material. Still yet other embodiments may include multiple layers of the same material, different materials, different alloys, non-metallic materials, etc.

In the illustrated embodiment of FIG. 1, the TIM assembly 100 includes release coating 120 illustrated on top of the upper surface or side 124 of the metallization, metal layer, or dry material 116. The TIM assembly 100 also includes another release coating 128 illustrated directly below the lower surface or second side 112 of the thermal interface material 104. The thermal interface material assembly 100 further includes release liner 132 illustrated on top of the upper surface or side 136 of the release coating 120. The TIM assembly 100 additionally includes release liner 140 illustrated directly below the lower surface or second side 144 of the release coating 128.

With continued reference to FIG. 1, the metallization, metal layer, or dry material 116 is illustrated as a separate layer from the release coating 120 and release liner 140. In some embodiments, however, the metallization, metal layer, or dry material 116, release coating 120, and release liner 140 may be provided as a subassembly, which, in turn, is then laminated, calendared, or otherwise provided to the thermal interface material 104. In these exemplary embodiments, the release liner 140 may comprise a substrate or supporting layer to which is applied the release coating 120 and the metallization, metal layer, or dry material 116. The metallization, metal layer, or dry material 116 may be a film or layer having a thickness of about 0.0005 inches or less (e.g., 0.0002 inches, 0.0001 inches, 5 angstroms, etc.). By way of example only, a film or layer of metal or dry material may be provided, applied, or coated onto the release side (the side having the release coating 120 thereon) of the substrate, supporting layer, or release liner 132. A metal or dry material may be provided, applied, or coated onto the release side by using vapor deposition, vacuum metallization, sputter technology, electrolytic plating, evaporating, flash coating, coating using gravure, flexographic coating, printing in a pattern, other coating technologies, etc. The thermal interface material 104 and the subassembly (comprising the release liner 132, release coating 120, and metallization, metal layer, or dry material 116) may then be laminated, such that the metallization, metal layer, or dry material 116 is disposed generally between the release coating 120 and thermal interface material 104 as shown in FIG. 1.

As another example, a film or layer of metal having a polymer coating on one side thereof may be provided or applied onto the release side (the side having the release coating 120 thereon) of the substrate, supporting layer, or release liner 132. The thermal interface material 104 and the subassembly (comprising the release liner 132, release coating 120, and metal layer/polymer coating 116) may then be laminated or otherwise provided, such that the metal layer/polymer coating 116 is disposed generally between the thermal interface material 104 and the release coating 120. In such embodiment, the polymer coating may be between the release coating 120 and the metal layer, which, in turn, may be between the polymer coating and the thermal interface material 104.

As a further exemplary embodiment, a layer or film of dry material (e.g., a dry polymer film, a transfer film, etc.) may be provided, applied, or coated onto the release side (the side having the release coating 120 thereon) of the substrate, supporting layer, or release liner 132. The thermal interface material 104 and the subassembly (comprising the release liner 132, release coating 120, and dry material 116) may then be laminated or otherwise provided, such that the dry material 116 is disposed generally between the release coating 120 and thermal interface material 104.

Figure 5:
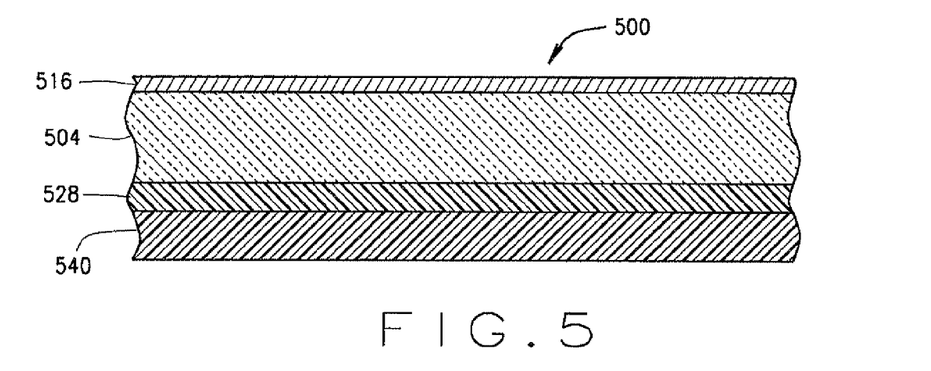
FIG. 5 is a cross-sectional view of another exemplary embodiment of a thermal interface material assembly having a thermal interface material, a metallization or metal layer, a lower release coating, and a lower release liner.

FIG. 5 illustrates another embodiment shown of a thermal interface material (TIM) assembly 500. As shown in FIG. 5, a metallization, metal layer, or dry material 516 may be directly provided or applied to a surface or side of the thermal interface material 504, for example, via vapor deposition, vacuum metallization, sputtering, flash coating, electrolytic plating, evaporating, coating using gravure, flexographic coating, printing material in a pattern, other coating technologies, among other suitable processes. In this example, the TIM assembly 500 includes a lower release coating 528 and release liner 540. But in this alternative embodiment, the TIM assembly 500 is shown in FIG. 5 without an upper release coating or an upper release liner. As the metallization, metal layer, or dry material 516 is directly provided, applied, metalized, etc. to the thermal interface material 504 in this embodiment, the metallization, metal layer, or dry material 516 is not provided to the thermal interface material 504 via lamination or calendaring of a subassembly including a supporting layer or substrate. By way of comparison, the metallization, metal layer, or dry material 116 of the TIM assembly 100 shown in FIG. 1 may be provided by way of laminating or calendaring the thermal interface material 104 and the subassembly comprised of the release liner 132 and the release coating 120 and metallization, metal layer, or dry material 116 supported thereby. As disclosed herein, the metallization, metal layer, or dry material 116 may be provided to the TIM assembly 100 by way of depositing one or more metals (e.g., copper, aluminum, etc.), non-metals (e.g., polymer, plastic, paper, dry film materials, transfer film materials, etc.), combinations thereof to the release side of the release liner, substrate, or supporting layer 132, which side has the release coating 120 thereon. Some example processes by which metal or dry material may be provided include vapor deposition, vacuum metallization, lamination, calendaring, sputtering, electrolytic plating, evaporating, flash coating, coating using gravure, flexographic coating, printing dry material in a pattern, other coating technologies, transferring or providing via a transfer carrier (e.g., polyester liner, etc.), among other suitable processes.

Figure 6:
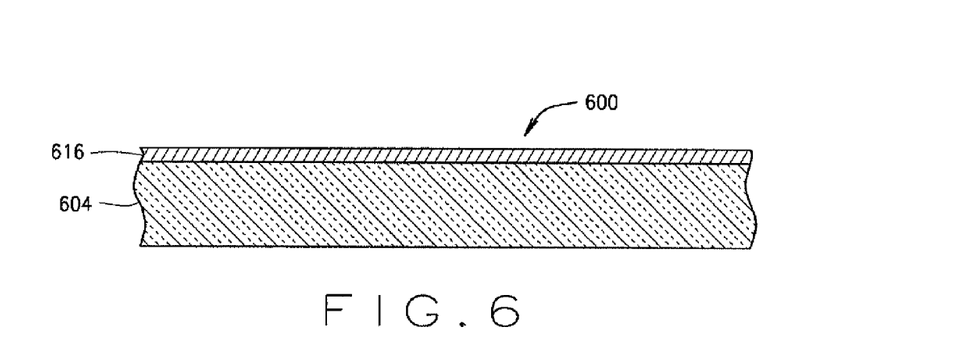
FIG. 6 is a cross-sectional view of a thermal interface material assembly having a thermal interface material and a dry film across the upper side of the thermal interface material according to exemplary embodiments.

Various materials may be used for the release coatings 120, 128 and release liners 140 shown in FIG. 1 as well as the other exemplary embodiments disclosed herein. By way for further example, the release liners 132 and 140 may comprise a substrate, supporting layer, film, or liner formed of paper, polyester propylene, etc., which has been siliconized to provide a release coating 120, 128 thereon. Other embodiments may include a carrier liner that is not treated (e.g., siliconized, etc.), but instead the dry material itself is configured to release from the carrier liner and transfer to the thermal interface material. For example, FIG. 6 illustrates an exemplary TIM assembly 600 including a thermal interface material 604 and dry material 616 disposed along the entire first side of the thermal interface material 604. In this exemplary embodiment, the dry material 616 itself was configured to release from an untreated carrier liner for transfer to the thermal interface material 604.

With reference back to FIG. 1, the release liners 132, 140 may be configured as the supporting substrate, layer, or film for the corresponding release coatings 120, 128, which, in turn, may be configured as low surface energy coatings on the supporting substrate, layer, or film, for example, to allow easy removal of the supporting substrate, layer, or film from the thermal interface material. In some embodiments, the release liner 132 and 140 are configured so as to help protect the other layers 104, 116 of the TIM assembly 100, for example, during transport, shipping, etc.

During an exemplary installation process, the release liners 132 and 140 may be removed (e.g., peeled off, etc.) from the TIM assembly 100. The removal of the release liners 132, 140 is facilitated by the release coatings 120, 128. The thermal interface 104 and metallization, metal layer, or dry material 116 may then be positioned generally between a heat sink and a heat-generating component (e.g., component of a high frequency microprocessor, printed circuit board, central processing unit, graphics processing unit, laptop computer, notebook computer, desktop personal computer, computer server, thermal test stand, etc.). For example, the thermal interface material's lower surface or side 112 (now exposed due to removal of the release liner 140) may be positioned against and in thermal contact with a surface of the heat sink. The upper surface or side 124 of the metallization, metal layer, or dry material 116 (also exposed due to removal of the release liner 132) may be positioned against and in thermal contact with a surface of the heat-generating component. In some embodiments, the upper surface or side 124 of the metallization, metal layer, or dry material 116 may comprise a polymer coating that is positioned against and in thermal contact with a surface of the heat-generating component. In other embodiments, the upper surface or side 124 of the metallization, metal layer, or dry material 116 may comprise a portion of a dry film or transfer film (e.g., dry polymer film, etc.) that is positioned against and in thermal contact with a surface of the heat-generating component. In still other embodiments, the upper surface or side 124 of the metallization, metal layer, or dry material may comprise a portion of the metal, metals, or alloys forming the metallization or metal layer 116 that is positioned against and in thermal contact with a surface of the heat-generating component. A thermally-conducting heat path from the heat-generating component to the heat sink may thus be established via the metallization, metal layer, or dry material 116 and thermal interface material 104. Alternative embodiments may reverse the orientation of the thermal interface 104 and the metallization, metal layer, or dry material 116 relative to the heat-generating component and heat sink. That is, some embodiments may include positioning the lower surface or side 112 of the thermal interface material 104 against and in thermal contact with a surface of the heat-generating component, and positioning the upper surface or side 124 of the metallization, metal layer, or dry material 116 against and in thermal contact with the heat sink. In yet other embodiments, the thermal interface 104 and metallization, metal layer, or dry material 116 may be used and installed elsewhere. The description provided above regarding an exemplary installation process for the TIM assembly 100 is provided for purposes of illustration only, as other embodiments of a TIM assembly may be configured and/or installed differently. For example, some embodiments include a TIM assembly having at least one metallization, metal layer, or dry material (e.g., dry film, transfer film, etc.) on the upper and lower surface of the thermal interface material. In such embodiments, the installation process may thus include positioning the upper metallization, metal layer, or dry material against and in thermal contact with a surface of a heat sink, and positioning the lower metallization, metal layer, or dry material against and in thermal contact with a surface of a heat-generating component.

Some embodiments may also include a heat-activated layer. For example, a heat-activated layer having a thickness of about 0.0003 inch may be disposed on top of the metallization, metal layer, or dry material 116. By way of further example, some embodiments may include a thermal interface material comprising a gap filler to which has been laminated a release liner, substrate, or supporting layer, which, in turn, may include a metallization, metal layer, or dry material, a release coating, and a heat-activated layer. In such exemplary embodiments, the heat-activated layer may add robustness for helping inhibit the metallization, metal layer, or dry material from breaking apart and/or flaking when the gap filler is deflected, for example, during installation in a gap between a heat-generating component and a heat sink. The heat-activated layer may also provide more secure adhesion to the gap filler, which, in turn, may be made of silicone to which it may be difficult to bond anything.

With continued reference to FIG. 1, an exemplary embodiment includes the thermal interface material 104 having a layer thickness (between the first and second sides 108, 112) of about 0.0075 inches. Continuing with this example, the metallization, metal layer, or dry material 116 may have a layer thickness of about 0.0005 inches or less (e.g., 0.0002 inches, 0.0001 inches, 5 angstroms, less than 0.0001 inches, less than 5 angstroms in some embodiments, etc.). The release coatings 120 and 124 may each have a respective layer thickness within a range of about 0.00025 inches and 00075 inches. The release liners 132 and 140 may each have a respective layer thickness of about 0.001 inch. In one particular embodiment, the metallization, metal layer, or dry material 116 may have a layer thickness of about 0.0005 inches. In another embodiment, the metallization, metal layer, or dry material 116 may have a layer thickness of about 0.0002 inches. In a further embodiment, the metallization, metal layer, or dry material 116 may have a layer thickness of about 0.0001 inches. In a yet another embodiment, the metallization, metal layer, or dry material 116 may have a layer thickness of about 5 angstroms. In additional embodiment, the metallization, metal layer, or dry material 116 may have a layer thickness less than 0.0001 inches or less than 5 angstroms. These numerical dimensions disclosed herein are provided for illustrative purposes only. The particular dimensions are not intended to limit the scope of the present disclosure, as the dimensions may be varied for other embodiments depending, for example, on the particular application in which the embodiment will be used.

FIG. 6 illustrates an exemplary embodiment of a TIM assembly 600 (FIG. 6) in which a dry material 616 comprises a film or layer disposed continuously along the entire upper side of the thermal interface material 604. In other exemplary embodiments, a TIM assembly may include dry material disposed only along one or more portions of a side of a thermal interface material. In such embodiments, the dry material may be configured and disposed along the thermal interface material in a pattern tailored for a custom release. In various embodiments, the dry material may be provided in predetermined pattern across a portion of the thermal interface material, such as a striped pattern (FIG. 10A), a uniform dotted pattern (FIG. 10B), and a non-uniform dotted pattern (FIG. 10C), etc. For example, the dry material may be provided or laid out in a dotted pattern such that the tack on the gap filler is deadened only at those locations where the dots are. Accordingly, this allows for a customized level of tack. As an example, the dry material patterned in a dot pattern may be used to hold a liner on, but make an edge of the TIM assembly relatively easy to lift off a liner.

Figure 7:
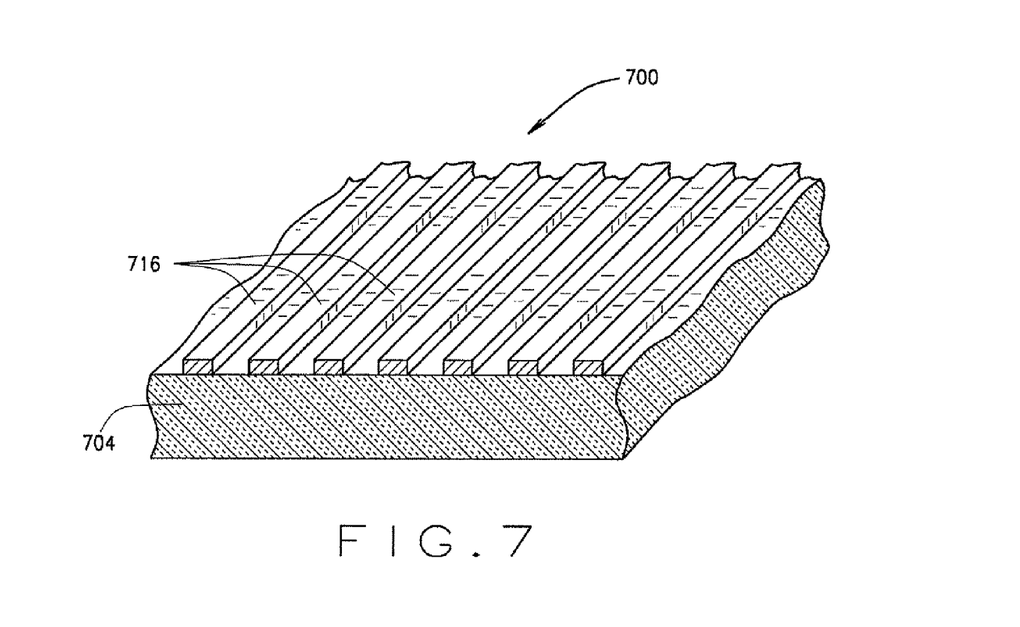
FIG. 7 is a perspective view of another exemplary embodiment of a thermal interface material assembly having a thermal interface material and dry material in a striped pattern across a portion of the thermal interface material.
Figure 8:
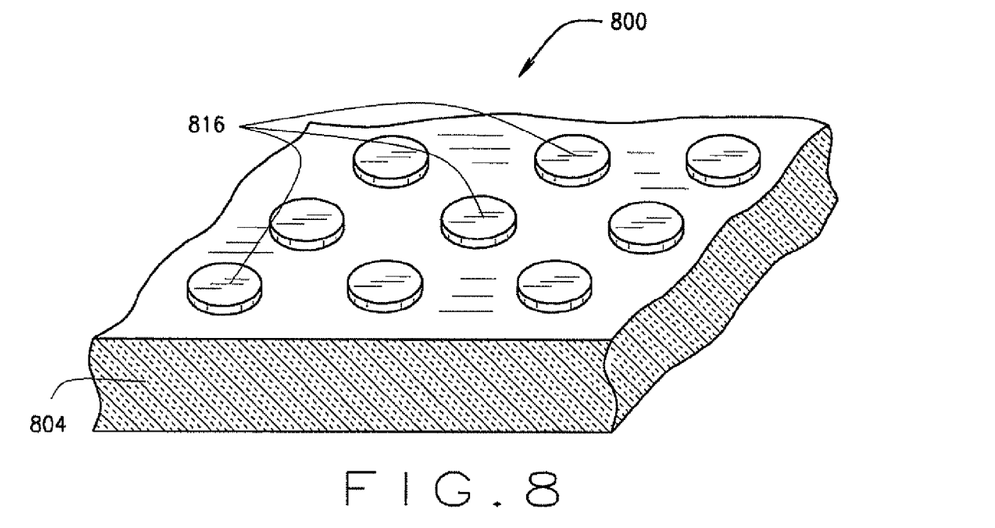
FIG. 8 is a perspective view of another exemplary embodiment of a thermal interface material assembly having a thermal interface material and dry material in a dotted pattern across a portion of the thermal interface material.

By way of further example, FIG. 7 illustrates another exemplary embodiment of a TIM assembly 700 having a thermal interface material 704 and dry material 716. In this example, the dry material 716 comprises strips of the dry material 716 forming a striped pattern across a portion of the thermal interface material 704. As another example, FIG. 8 illustrates another exemplary embodiment of a TIM assembly 800 having a thermal interface material 804 and dry material 816. In this example, the dry material 816 comprises generally circular patches of the dry material 816 forming a dotted pattern across a portion of the thermal interface material 804. Alternative embodiments may include a wide range of other patterns, depending, for example, on the release level desired by the end-user or customer.

Descriptions will now be provided of various exemplary methods for making or producing a TIM assembly (e.g., 100 (FIG. 1), 500 (FIG. 5), 600 (FIG. 6), 700 (FIG. 7), 800 (FIG. 8), etc.). These examples are provided for purposes of illustration, as other methods, materials, and/or configurations may also be used.

Figure 2:
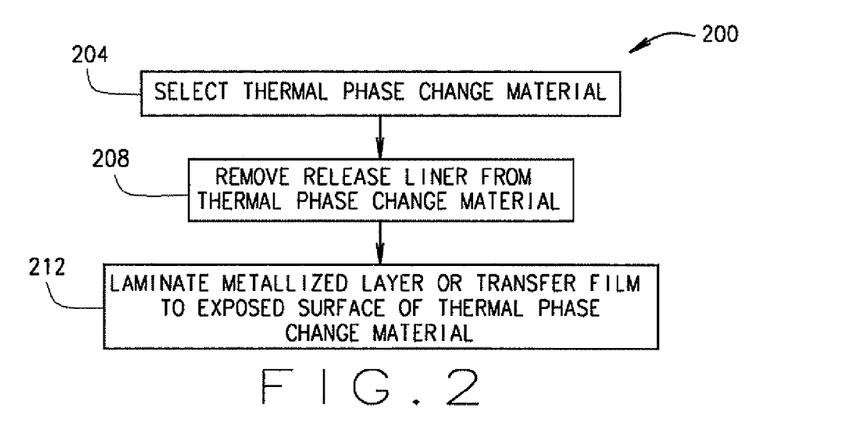
FIG. 2 is a process flow diagram of an exemplary method that includes laminating a metallization layer or transfer film to a thermal phase change material according to exemplary embodiments.

FIG. 2 illustrates an exemplary method 200 by which a TIM assembly may be formed. In this particular exemplary method 200, process 204 includes selecting a thermal phase change material (e.g., 104, etc.) to which is attached an upper release liner and a lower release liner (e.g., 140, etc.). By way of example, the thermal phase change material may be a T-pcm™ 580S series thermal phase change material from Laird Technologies, Inc. Alternative materials may also be used, including thermal interface materials without any release liner, thermal interface materials with only one release liner, and thermal interface materials that are not thermal phase change materials.

With continued reference to FIG. 2, process 208 includes removing one of the release liners from the thermal phase change material. In those embodiments in which the thermal phase change material selected at process 204 does not include any preexisting release liners or includes only one release liner, process 208 may not be needed.

Process 212 includes laminating a metallization, metal layer, or dry material (e.g., 116, a copper layer, an aluminum layer, a tin layer, one or more layers formed from other metals, a metal layer with a polymer coating, a dry film, a transfer film, etc.) to the exposed surface of the thermal phase change material from which the release liner was previously removed at process 208. During the laminating process 212, for example, the various materials may be drawn between a pair of laminating rollers that form a laminating nip. By way of example, process 212 may include laminating a Dunmore DT273 metallized film having heat-activated adhesive layer to the exposed surface of the thermal phase change material. In which case, the thermal phase change material and the Dunmore DT273 metallized film may thus be drawn between a pair of laminating rollers that form a laminating nip. As another example, process 212 may include laminating a Dunmore DT101 metallization transfer layer to the exposed surface of the thermal phase change material. In this latter example, the thermal phase change material and the Dunmore DT101 metallization transfer layer may thus be drawn between a pair of laminating rollers that form a laminating nip. Dunmore DT273 metallized film generally includes a siliconized (or release coating) liner (or supporting layer, substrate, or film) having a thickness of about 1 mil or 2 mil, which has been metallized with aluminum at about 0.1 mils thickness and to which a heat seal layer is deposited on top of the metallization layer with a thickness of about 0.3 mils. Dunmore DT101 metallized transfer film is similarly constructed as the DT273 but without the heat seal layer. Alternative materials may also be laminated at process 212 to the exposed surface of the thermal phase change material including one or more other metals, alloys, non-metallic materials, dry films, transfer films, etc.

The thermal resistance was measured for test specimens made in accordance with the method 200. For this testing, first, second and third test specimens were created. The first test specimen included a T-pcm™ 580S series thermal phase change material having a release liner on its lower side and a Dunmore DT273 metallized film laminated to the thermal phase change material's upper side (i.e., the side from which the release liner had been removed at process 208). The second test specimen included a T-pcm™ 580S series thermal phase change material having a release liner on its lower side and a Dunmore DT101 metallized transfer film laminated to the thermal phase change material's upper side (i.e., the side from which the release liner had been removed at process 208). The third test specimen included T-pcm™ 580S series phase change material and dry film.

The thermal resistances for the first, second, and third test specimens were tested separately as follows. The lower release liner (i.e., the lower pre-existing release liner that was not removed at process 208) was removed from the thermal phase change material. The thermal phase change material was then placed exposed side down (the side from which the lower release liner was removed, or the side not having laminated thereto the Dunmore product) on an ASTM D5470 platen. The protective release liner was removed from the Dunmore DT273 metallized film for the first test specimen and from the Dunmore DT101 metallized transfer film for the second test specimen. For each test specimen, the pressure was closed to a pressure of 50 pounds per square inch, and thermal resistance was measured at 70° C. Using this exemplary testing, the thermal resistance was about 0.08° C.-in$^2$/W for the first test specimen, which was formed from T-pcm™ 580 S series phase change material and Dunmore DT273 metallized film. The thermal resistance was about 0.02° C.-in²/W for the second test specimen, which was formed from T-pcm™ 580S series phase change material and Dunmore DT101 metallized transfer film. The thermal resistance was about 0.022° C.-in²/W for the third test specimen, which was formed from T-pcm™ 580S series phase change material and dry film with a sample thickness of 8 mils and an sample area of 1 inch square disk. By way of comparison, the thermal resistance of the T-pcm™ 580S series phase change material alone (i.e., without any metallization, metal layers, or films laminated thereto and without any release liners or release coatings) was about 0.01° C.-in²/W. In addition, the thermal resistance was about 0.042° C.-in²/W for a T-pcm™ 580S series phase change material on a 0.7 mil thick aluminum foil.

Figure 3:
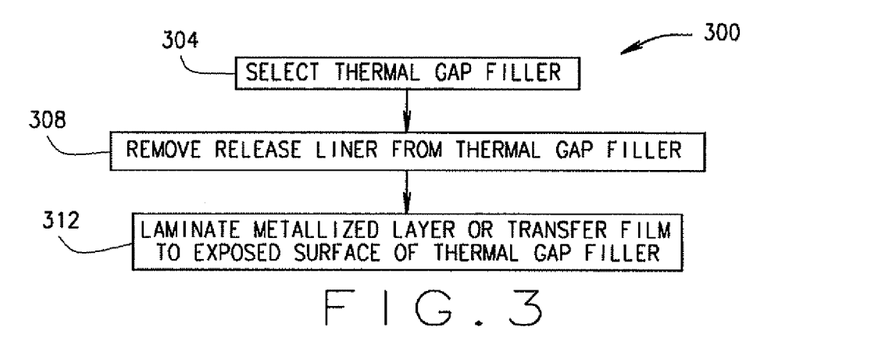
FIG. 3 is a process flow diagram of another exemplary method that includes laminating a metallization layer or transfer film to a thermal gap filler according to exemplary embodiments.

FIG. 3 illustrates an exemplary method 300 by which a TIM assembly may be formed. In this particular exemplary method 300, process 304 includes selecting a thermal gap filler (e.g., 104, etc.) to which is attached an upper release liner and a lower release liner (e.g., 140, etc.). By way of example, the thermal gap filler may be a T-flex™ 600 series gap filler from Laird Technologies, Inc. In other embodiments, the thermal phase change material may be a T-pcm™ 580S series thermal phase change material from Laird Technologies, Inc. Alternative materials may also be used, including thermal interface materials without any release liner or only one release liner.

With continued reference to FIG. 3, process 308 includes removing one of the release liners from the thermal gap filler. In those embodiments in which the thermal gap filler selected at process 304 does not include any preexisting release liners or includes only one release liner, process 308 may not be needed.

Process 312 includes laminating a metallization, metal layer, or film (e.g., 116, etc.) to the exposed surface of the thermal gap filler from which the release liner was previously removed at process 308. During the laminating process 312, for example, the various materials may be drawn between a pair of laminating rollers that form a laminating nip. By way of example, process 312 may include laminating a Dunmore DT273 or GK14341 metallized film having heat-activated adhesive layer to the exposed surface of the thermal gap filler. In which case, the thermal gap filler and the Dunmore DT273 or GK14341 metallized film may thus be drawn between a pair of laminating rollers that form a laminating nip. As another example, process 312 may include laminating a Dunmore DT101 metallization transfer layer to the exposed surface of the thermal gap filler. In this latter example, the thermal gap filler and the Dunmore DT101 metallization transfer layer may thus be drawn between a pair of laminating rollers that form a laminating nip. Alternative materials may also be laminated at process 312 to the exposed surface of the thermal phase change material including one or more other metals, alloys, non-metallic materials, dry films, transfer films, etc.

The thermal resistance was measured for a first test specimen made in accordance with the method 300. The test specimen included a gap filler having a release liner on one side and a Dunmore GK14341 metallized film laminated to the other side of the gap filler from which the release liner had been previously removed at process 308. The thermal resistance for this test specimen was tested as follows. The lower release liner (i.e., the lower pre-existing release liner that was not removed at process 308) was removed from the gap filler. The gap filler was then placed exposed side down (the side from which the lower release liner was removed, or the side not having laminated thereto the GK14341 metallized film) on an ASTM D5470 platen. The protective release liner was removed from the Dunmore GK14341 metallized film. The pressure was closed to a pressure of 10 pounds per square inch, and thermal resistance was measured at 50° C. Using this exemplary testing, the thermal resistance was about 0.539° C.-in²/W for this test specimen formed from gap filler and Dunmore GK14341 metallized film. Other test specimens were also tested using the above-described testing conditions. For example, the thermal resistance was about 0.516° C.-in²/W for a test specimen formed from gap filler and a Dunmore 14071 non-metallized film. By way of comparison, the thermal resistance of the gap filler alone (i.e., without any metallization or metal layers laminated thereto and without any release liners or release coatings) was about 0.511° C.-in²/W. In addition, the thermal resistance was about 0.840° C.-in²/W for a gap filler having a relatively thick silicone-based conformal dry coating.

Figure 4:
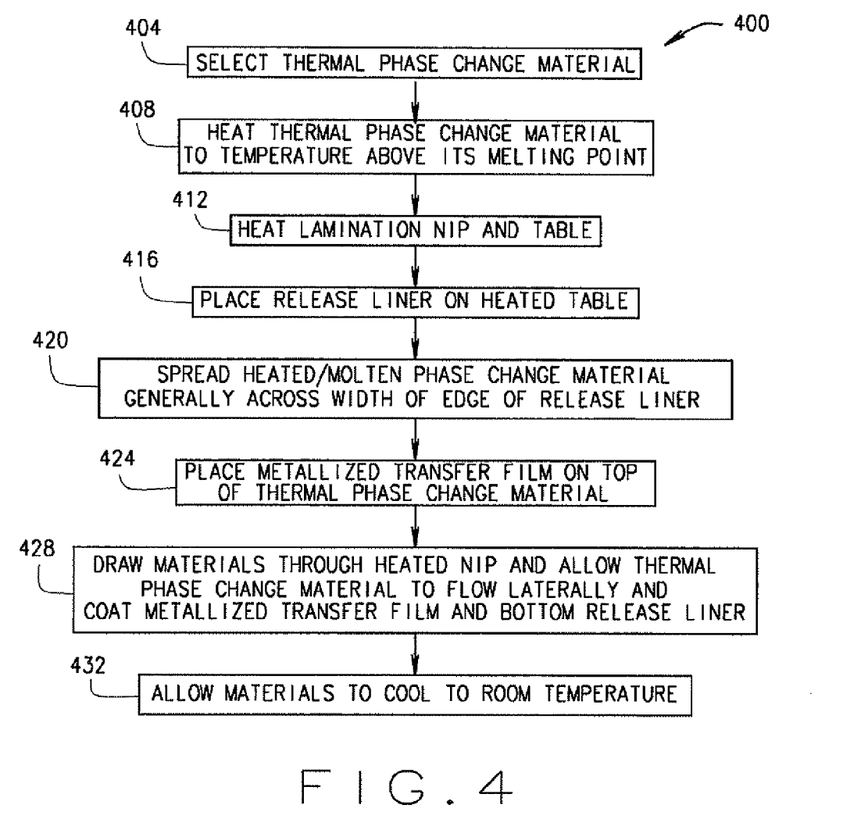
FIG. 4 is a process flow diagram of another exemplary method for making a thermal interface material assembly that includes a thermal interface material and a metallization or metal layer.

FIG. 4 illustrates another exemplary method 400 by which a TIM assembly may be formed. Generally, this method 400 includes casting a thermal interface material (e.g., thermal phase change material, thermally conductive insulator, gap filler, putty, etc.) using the metallized transfer film or other suitable film (e.g., non-metallized transfer film, dry film or layer, etc.) as a liner via a solvent or non solvent process. For example, in those embodiments which use a phase change material, the phase change material may be heated above its melt point and extruded using the metallized transfer film as one of two liners.

In the particular illustrated embodiment 400 shown in FIG. 4, process 404 includes selecting a thermal phase change material. For example, the thermal interface phase change material may be in bulk without any release liners. In such embodiments, the thermal interface phase change material may be discharged from a dispenser onto a release coated liner or a metallization or metal layer. By way of further example, the thermal phase change material may be a T-pcm™ 580S series thermal phase change material commercially available from Laird Technologies, Inc. Alternative materials may also be used, including thermal interface materials without any release liners, only one release liner, or upper and lower release liners. In those embodiments in which the thermal phase change material includes one or more release liners, the method 400 also includes removing the release liners.

Process 408 includes heating the thermal phase change material to a temperature above its melting point. For example, some embodiments may include heating the thermal phase change material to about 100° C. Other embodiments may include heating the thermal phase change material to a higher or lower temperature depending on the particular thermal phase change material selected at process 404 and the melting temperature thereof.

Process 412 includes heating a lamination nip and a table. For example, some embodiments may include heating the lamination nip and table to about 100° C. Alternative embodiments may include heating the lamination nip and table to a higher or lower temperature depending on the particular thermal phase change material selected at process 400. The lamination nip may be formed by a pair of laminating rollers.

Process 416 includes placing a release liner on the heated table. In some embodiments, the release liner comprises siliconized polyester or paper. Alternative embodiments may include release liners comprising other suitable materials.

Process 420 includes spreading the heated and molten phase change material generally across a width of at least one edge of the release liner.

Process 424 includes placing a metallized transfer film (or other film in other embodiments) on top of the thermal phase change material. Accordingly, the thermal phase change material is thus disposed generally between or sandwiched generally by the release liner (on the bottom) and the metallized transfer film (on the top). In alternative method embodiments, the orientation or arrangement of the layers may be reversed such that the thermal phase change material is disposed generally between or sandwiched generally by the release liner (on the top) and the metallized transfer film (on the bottom). In such alternative methods, the metallization transfer film may be placed on the heated table at process 416 with the heated and molten phase change material then being spread generally across a width of at least one edge of the metallized transfer film at process 420.

Process 428 includes pulling or drawing the stack of materials (e.g., release liner, thermal phase change material, and metallized transfer film) through the heated lamination nip and allowing the thermal phase change material to flow laterally and coat the metallized transfer film and release liner.

Process 432 includes allowing the laminated stack of materials (release liner, thermal phase change material, and metallized transfer film) to cool to room temperature.

Figure 9:
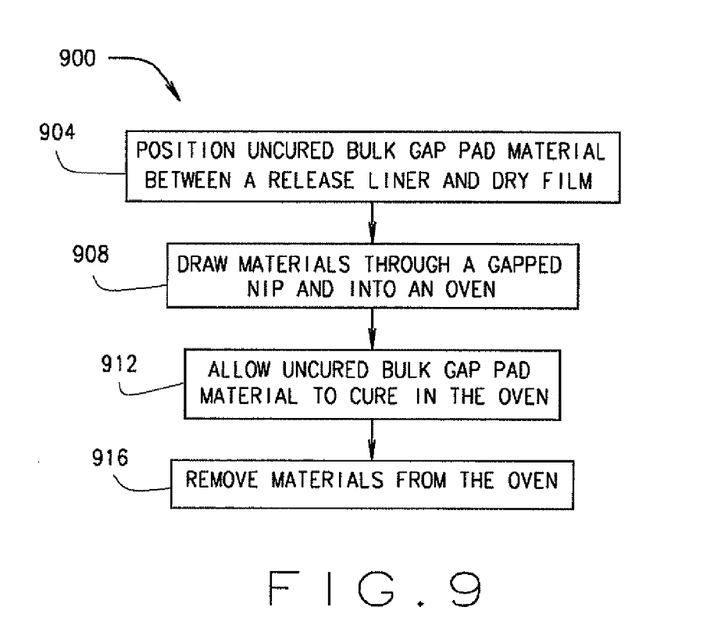
FIG. 9 is a process flow diagram of another exemplary method for making at thermal interface material assembly that includes a thermal interface material and a dry material.

FIG. 9 illustrates another exemplary method 900 by which a TIM assembly may be formed. Generally, this method 900 includes using a dry film as one of the carriers between which uncured bulk gap pad material is sandwiched or disposed before curing of the gap pad material. The stacked or sandwiched materials may include a release liner on top, a dry film on bottom, and uncured bulk gap pad material in the middle. The stacked materials may be pulled through a gapped nip and into an oven in which the uncured bulk gap pad is then cured.

With continued reference to FIG. 9, the method 900 may include process 904 at which uncured bulk gap pad material is disposed or sandwiched between a release liner and a dry film. By way of example, the uncured gap pad material may be uncured T-flex™ gap filler material or T-pli™ gap filler material from Laird Technologies, etc., the release liner may be a polyester carrier liner, and the dry film may be a polymer dry film. Alternative materials may also be used for the gap pad material, release liner, and dry film.

Process 908 includes drawing the uncured bulk gap material, dry film, and release liner through a gapped nip and into an oven. By way of example, the oven temperature may be about 100 degrees Celsius and the curing time may be about 30 minutes.

Process 912 includes allowing the uncured bulk gap pad material to cure in the oven. Process 916 includes removing the stack of materials (i.e., the release liner, now-cured gap pad material, and dry film) from the oven.

After removal from the oven at process 916, the material assembly may later be shipped to a customer for subsequent installation. In this particular example method 900, the material assembly includes only one release liner, which may allow for increase speed along the manufacturing line and reduced costs, such as less material and shipping costs as compared to those material assemblies having two or more release liners. During an exemplary installation, the top release liner may be removed (e.g., peeled off, etc.) from the cured gap pad material. In various embodiments, the removal of the release liner may be facilitated by a release coating. After removing the release liner, the cured gap pad material with the dry film thereon may then be positioned generally between a heat sink and a heat-generating component (e.g., component of a high frequency microprocessor, printed circuit board, central processing unit, graphics processing unit, laptop computer, notebook computer, desktop personal computer, computer server, thermal test stand, etc.). For example, the exposed surface of the cured gap pad material (which is exposed due to removal of the release liner) may be positioned against and in thermal contact with a surface of the heat sink. The outer surface or side of the dry film may be positioned against and in thermal contact with a surface of the heat-generating component. A thermally-conducting heat path from the heat-generating component to the heat sink may thus be established via the dry film and cured gap pad material. Alternative embodiments may reverse the installation orientation of the cured gap pad material and dry film relative to the heat-generating component and heat sink. That is, some embodiments may include positioning the exposed surface or side of the cured gap pad material against and in thermal contact with a surface of the heat-generating component, and positioning the outer surface or side of the dry film against and in thermal contact with the heat sink. In yet other embodiments, the cured gap pad material and dry film may be used and installed elsewhere. The description provided above regarding an exemplary method of making the TIM assembly and exemplary installation process are provided for purposes of illustration only, as other embodiments of a TIM assembly may be made, configured and/or installed differently.

Even though TIM assemblies may be formed from thermal interface materials and metallizations, metal layers, and dry materials as disclosed above and shown in FIGS. 2-4 and 8, such is not required for all embodiments. For example, other embodiments may include other processes besides laminating (FIGS. 2 and 3), casting (FIG. 4), and curing in an oven (FIG. 9). By way of example, other embodiments may include directly metallizing a surface of a thermal interface material via vapor deposition, sputtering, or vacuum metallization rather than lamination. Additional embodiments may include thin metal layers, thin dry materials, or thin transfer films that are applied via transfer from a carrier (e.g., polyester liner, etc.) or directly flash coated onto a thermal interface material. Still further embodiments may include calendaring between rollers. Other example processes by which a metal or dry material may be provided to a thermal interface material include electrolytic plating, evaporating, coating using gravure, flexographic coating, printing in a pattern, other coating technologies, among other suitable processes.

Embodiments (e.g., 100, 500, 600, 700, 800, etc.) disclosed herein may be used with a wide range of heat-generating components, heat sinks, and associated devices. By way of example only, exemplary applications include printed circuit boards, high frequency microprocessors, central processing units, graphics processing units, laptop computers, notebook computers, desktop personal computers, computer servers, thermal test stands, etc. Accordingly, aspects of the present disclosure should not be limited to use with any one specific type of heat-generating component or associated device.

Numerical dimensions and the specific materials disclosed herein are provided for illustrative purposes only. The particular dimensions and specific materials disclosed herein are not intended to limit the scope of the present disclosure, as other embodiments may be sized differently, shaped differently, and/or be formed from different materials and/or processes depending, for example, on the particular application and intended end use.

Certain terminology is used herein for purposes of reference only, and thus is not intended to be limiting. For example, terms such as "upper", "lower", "above", "below", "upward", "downward", "forward", and "rearward" refer to directions in the drawings to which reference is made. Terms such as "front", "back", "rear", "bottom" and "side", describe the orientation of portions of the component within a consistent, but arbitrary, frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A thermal interface material assembly comprising:
   a thermal interface material having a first side and a second side, and which is conformable to a mating surface; and
   a dry material having a thickness of about 0.0005 inches or less, the dry material disposed along at least a portion of the first side of the thermal interface material;
   wherein the dry material is configured to be releasable from a mating component when in contact therewith, thereby allowing the thermal interface material assembly after being positioned with the dry material against the mating component to release from the mating component and with the dry material remaining disposed along the thermal interface material;
   wherein the dry material comprises a metal layer having a thickness of about 0.0005 inches or less, the metal layer having first and second sides, the first side of the metal layer disposed along at least a portion of the first side of the thermal interface material; and wherein a polymer coating is on at least a portion of the second side of the metal layer.

2. The thermal interface material assembly of claim 1, wherein the dry material comprises a dry material configured to release from a carrier liner for transfer to the first side of the thermal interface material, whereupon removal of the carrier liner, the dry material remains disposed along the thermal interface material and is exposed for positioning against a mating component.

3. The thermal interface material assembly of claim 1, wherein the dry material is disposed along two or more portions of the first side of the thermal interface material in a predetermined pattern tailored for a custom release of the thermal interface material assembly such that tack on the thermal interface material is deadened where the dry material is located.

4. The thermal interface material assembly of claim 1, wherein the dry material is configured to allow for a clean release of thermal interface material assembly from a surface in contact with the dry material.

5. The thermal interface material assembly of claim 1, wherein the dry material has a thickness of 0.0005 inches or 5 angstroms.

6. The thermal interface material assembly of claim 1, wherein the dry material is disposed along at least a portion of only the first side of the thermal interface material.

7. The thermal interface material assembly of claim 1, further comprising a release liner having a release side with a release coating thereon, and wherein the dry material is disposed on the release side of the release liner, wherein the release liner is configured to be removable from the thermal interface material assembly such that removal of the release liner exposes the dry material which remains disposed along the first side of the thermal interface material for positioning against a mating component.

8. The thermal interface material assembly of claim 1, further comprising a substrate supporting the dry material, and wherein the substrate is laminated to the thermal interface material such that the dry material is between the substrate and the first side of the thermal interface material, and wherein the substrate is removable from the thermal interface material assembly to thereby expose the dry material, which remains disposed along the first side of the thermal interface material for positioning against a mating component.

9. The thermal interface material assembly of claim 1, further comprising:
   an upper release liner including a release coating and supporting the dry material such that the dry material is between the release coating and the first side of the thermal interface material; wherein the release coating is configured to allow the upper release liner to be removed from the thermal interface material assembly such that the dry material is exposed and remains disposed along the first side of the thermal interface material for positioning against a mating component; and
   a lower release liner having a release side with a release coating thereon, the lower release liner laminated such that the release coating is between the lower release liner and the second side of the thermal interface material.

10. The thermal interface material assembly of claim 1, wherein the dry material is deposited directly onto the thermal interface material, and wherein the thermal interface material comprises polymer.

11. The thermal interface material assembly of claim 1, wherein the thermal interface material comprises a compliable or conformable thermal interface material including one or more of a gap filler, a gap pad, or a putty.

12. The thermal interface material assembly of claim 1, further comprising a release liner having a release side with a release coating thereon, wherein the dry material is disposed on the release side of the release liner, and wherein the release liner is laminated to the thermal interface material such that the dry material is between the release liner and the first side of the thermal interface material.

13. The thermal interface material assembly of claim 1, wherein the dry material has a color different than the thermal interface material.

14. An apparatus comprising the thermal interface material assembly of claim 1, a heat-generating component, and a heat sink, wherein the thermal interface material assembly is disposed between the heat-generating component and the heat sink such that a thermally-conducting heat path is defined by the heat-generating component, the thermal interface material assembly, and the heat sink.

15. The thermal interface material assembly of claim 1, wherein the dry material and polymer coating have a combined thickness of 0.0005 inches.

16. The thermal interface material assembly of claim 1, wherein the dry material and polymer coating have a combined thickness of 0.0001 inches.

17. The thermal interface material assembly of claim 1, wherein the polymer coating has a thickness of about 5 angstroms.

18. The thermal interface material assembly of claim 1, wherein the thermal interface material comprises a compliable or conformable thermal interface material including one or more of a gap filler, a gap pad, a phase change material, putty, or a thermally conductive insulator.

19. An apparatus comprising the thermal interface material assembly of claim 18, a heat-generating component, and a heat sink, wherein the thermal interface material assembly is disposed between the heat-generating component and the heat sink such that a thermally-conducting heat path is defined by the heat-generating component, the thermal interface material assembly, and the heat sink.

20. A method of making the thermal interface material assembly of claim 1, the method comprising providing the thermal interface material, which is conformable to a mating surface, with the dry material along at least the portion of the first side of the thermal interface material such that the dry material has a thickness of about 0.0005 inches or less.

21. The method of claim 20, wherein providing the thermal interface material with the dry material includes depositing material directly onto a surface portion of the thermal interface material or onto a surface portion of a release liner for subsequent transfer to the thermal interface material.

22. The method of claim 20, wherein providing the thermal interface material with a dry material includes one or more of vapor deposition, vacuum metallization, flash coating, coating using gravure, flexographic coating, or printing the dry material in a pattern.

23. The method of claim 20, wherein providing the thermal interface material with the dry material includes laminating the thermal interface material and a substrate supporting the dry material such that the dry material is between the substrate and the first side of the thermal interface material.

24. The method of claim 23, further comprising depositing dry material onto the substrate via one or more of vapor deposition, vacuum metallization, sputtering, coating using gravure, flexographic coating, or printing the dry material in a pattern onto the substrate.

25. The method of claim 23, wherein the substrate includes a release liner having a release side with a release coating thereon, and wherein the dry material is disposed on the release side of the release liner.

26. The method of claim 20, wherein providing the thermal interface material with the dry material includes transferring a dry material from a carrier liner to the thermal interface material.

27. The method of claim 20, wherein providing the thermal interface material with the dry material includes providing the thermal interface material with a dry film having a thickness of about 0.0005 inches or about 5 angstroms.

28. The method of claim 20, wherein providing the thermal interface material with the dry material includes casting the thermal interface material using a transfer film as a liner via a solvent or non-solvent process.

29. The method of claim 20, wherein the thermal interface material comprises a phase change material, and wherein providing the thermal interface material with the dry material includes:
heating the phase change material to a temperature above a melting temperature of the phase change material; and
extruding the molten phase change material while using a transfer film as a liner.

30. The method of claim 20, wherein the thermal interface material comprises a phase change material, and wherein providing the thermal interface material with the dry material includes:
heating the phase change material to a temperature above a melting temperature of the phase change material;
heating a lamination nip and a table;
placing one of a release liner or a transfer film on the heated table;
spreading the heated molten phase change material across a width of at least one edge of said one of the release liner or transfer film that was placed on the heated table;
placing the other one of said release liner and transfer film on the phase change material such that the phase change material is between the release liner and transfer film;
drawing the release liner, phase change material, and transfer film through the heated lamination nip and allowing the phase change material to flow laterally and coat the transfer film and release liner; and
allowing the release liner, phase change material, and transfer film to cool to room temperature.

31. The method of claim 20, wherein the thermal interface material comprises a gap pad material, and wherein providing the thermal interface material with the dry material includes:
drawing uncured bulk gap material sandwiched between a dry film, and a release liner through a gapped nip and into an oven; and
allowing the uncured bulk gap pad material to cure in the oven.

32. A method associated with heat transfer from a heat-generating component, the method comprising installing the thermal interface material assembly of claim 1 between a surface of the heat-generating component and a surface of a heat sink to thereby establish a thermally conducting heat path defined by the heat-generating component, the thermal interface material assembly, and the heat sink.

33. The method of claim 32, wherein the dry material comprises a dry film configured to allow the thermal interface material assembly to release relatively cleanly and easily from the surface against which the dry film was positioned when the thermal interface material assembly was installed between the heat-generating component and heat sink.

* * * * *